United States Patent
Kawai

(10) Patent No.: US 8,504,955 B2
(45) Date of Patent: Aug. 6, 2013

(54) TIMING ADJUSTMENT DEVICE AND METHOD THEREOF

(75) Inventor: Shigeki Kawai, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 313 days.

(21) Appl. No.: 12/783,310

(22) Filed: May 19, 2010

(65) Prior Publication Data

US 2010/0299644 A1 Nov. 25, 2010

(30) Foreign Application Priority Data

May 22, 2009 (JP) .................................. 2009-124699

(51) Int. Cl.
*G06F 17/50* (2006.01)

(52) U.S. Cl.
USPC ............ 716/108; 716/100; 716/132; 716/134

(58) Field of Classification Search
USPC .......................... 716/100, 106–108, 132, 134
See application file for complete search history.

(56) References Cited

U.S. PATENT DOCUMENTS

| | | | |
|---|---|---|---|
| 6,567,484 B1 | 5/2003 | Hirota et al. | |
| 2003/0102928 A1* | 6/2003 | d'Haene et al. | 331/172 |
| 2003/0154416 A1 | 8/2003 | Laberge | |
| 2003/0169837 A1* | 9/2003 | Takatori et al. | 375/376 |
| 2005/0262459 A1* | 11/2005 | Schumann | 716/6 |
| 2007/0075758 A1* | 4/2007 | Fiedler | 327/158 |
| 2008/0201597 A1* | 8/2008 | Chong et al. | 713/401 |
| 2010/0271092 A1* | 10/2010 | Zerbe et al. | 327/161 |
| 2011/0068844 A1* | 3/2011 | Kup | 327/276 |
| 2012/0146700 A1* | 6/2012 | Pan et al. | 327/231 |

FOREIGN PATENT DOCUMENTS

| | | |
|---|---|---|
| JP | 2000-031951 | 1/2000 |
| JP | 2003-091453 A | 3/2003 |

* cited by examiner

*Primary Examiner* — Paul Dinh
(74) *Attorney, Agent, or Firm* — Arent Fox LLP

(57) ABSTRACT

A timing adjustment device includes a plurality of receive circuits that receive an input signal based on mutually different timings, a determination circuit that determines a first transition and a second transition of the input signal based on a received result by receive circuits, among the plurality of receive circuits, that receive the input signal with adjacent timings among different timings of the plurality of receive circuits, and an adjustment circuit that adjusts the receiving timing of the input signal so that the receiving timing of the input signal becomes close to a central timing of a period according to the first transition and the second transition.

11 Claims, 13 Drawing Sheets

FIG. 9

| n | D(n) | | | | | | | CALCULATION RESULT DR | DATA FLAG DF |
|---|---|---|---|---|---|---|---|---|---|
| | -3 | -2 | -1 | 0 | +1 | +2 | +3 | | |
| PATTERN1 | 0 | 0 | 1 | 1 | 1 | 0 | 0 | 0 | 1 |
| PATTERN2 | 0 | 0 | 0 | 1 | 1 | 1 | 0 | +1 | 1 |
| PATTERN3 | 0 | 0 | 0 | 0 | 0 | 1 | 0 | 0 | 0 |
| PATTERN4 | 0 | 0 | 1 | 1 | 1 | 1 | 0 | +1 | 1 |
| PATTERN5 | 0 | 0 | 0 | 0 | 1 | 1 | 0 | +2 | 1 |
| PATTERN6 | 1 | 1 | 1 | 1 | 0 | 0 | 1 | +2 | 1 |
| PATTERN7 | 1 | 1 | 0 | 1 | 1 | 1 | 0 | 0 | 0 |
| PATTERN8 | 0 | 1 | 0 | 0 | 1 | 1 | 1 | 0 | 0 |
| PATTERN9 | 0 | 0 | 0 | 1 | 1 | 1 | 1 | 0 | 0 |

FIG. 11

| n | | -3 | -2 | -1 | 0 | +1 | +2 | +3 | CALCULATION RESULT DR | DATA FLAG DF |
|---|---|---|---|---|---|---|---|---|---|---|
| DATA1 | D0 | 0 | 0 | 0 | 1 | 1 | 1 | 0 | | |
| | D1 | 0 | 0 | 1 | 1 | 1 | 1 | 0 | | |
| | D2 | 1 | 1 | 1 | 1 | 1 | 1 | 1 | | |
| | D3 | 0 | 1 | 1 | 1 | 1 | 1 | 0 | | |
| | AND | 0 | 0 | 0 | 1 | 1 | 1 | 0 | +1 | 1 |
| DATA2 | D0 | 0 | 0 | 0 | 0 | 1 | 1 | 0 | | |
| | D1 | 0 | 0 | 0 | 0 | 1 | 1 | 0 | | |
| | D2 | 0 | 0 | 1 | 0 | 1 | 1 | 0 | | |
| | D3 | 0 | 0 | 0 | 1 | 1 | 1 | 0 | | |
| | AND | 0 | 0 | 0 | 0 | 1 | 1 | 0 | +1 | 1 |

FIG. 13

| n | D(n) -3 | -2 | -1 | 0 | +1 | +2 | +3 | DATA FLAG DF |
|---|---|---|---|---|---|---|---|---|
| DATA1 | 0 | 0 | 0 | 1 | 1 | 1 | 0 | 1 |
| DATA2 | 0 | 0 | 1 | 1 | 1 | 0 | 0 | 1 |
| DATA3 | 0 | 0 | 1 | 1 | 1 | 1 | 0 | 1 |
| DATA4 | 0 | 0 | 0 | 0 | 1 | 1 | 0 | 1 |
| DATA5 | 1 | 1 | 1 | 1 | 1 | 1 | 1 | 0 |
| DATA6 | 0 | 1 | 0 | 1 | 1 | 1 | 0 | 0 |
| DATA7 | 0 | 0 | 0 | 0 | 1 | 1 | 1 | 0 |
| ACCUMULATED VALUE | 0 | 0 | 2 | 3 | 4 | 3 | 0 | |

TIMING ADJUSTMENT DEVICE AND METHOD THEREOF

CROSS-REFERENCE TO RELATED APPLICATION

This application is based upon and claims the benefit of priority of the prior Japanese Patent Application No. 2009-124699, filed on May 22, 2009, the entire contents of which are incorporated herein by reference.

FIELD

The application relates to a timing adjustment device and method thereof.

BACKGROUND

Conventionally, a Dynamic Random Access Memory (DRAM) has been used as a semiconductor storage device. Recently, a Double Data Rate (DDR) method is employed as a fast data transfer method in order to address high speed system operation. A DRAM using DDR is called as a Double Data Rate Synchronous DRAM (DDR-SDRAM) or a DDR2-SDRAM.

The Double Data Rate SDRAM (hereinafter, simply referred to as a "memory") outputs data in synchronization with a data strobe signal. A memory controller, included in a system circuit that is coupled to the memory, accesses the memory in response to a request from a CPU included in the system circuit. As illustrated in FIG. 1, the memory controller includes a Delay Locked Loop (DLL) circuit 101 and flip-flop circuits 102 and 103. As illustrated in FIG. 2, the DLL circuit 101 generates a delayed data strobe signal (hereinafter, referred to as a "delay signal") DQSd that is delayed for a given time from the data strobe signal DQS. The flip-flop circuit 102 latches the data DQ in response to the delay signal DQSd. The flip-flop circuit 103 latches an output signal of the flip-flop circuit 102 in response to a clock signal (not illustrated) of the system side. The output signal of the flip-flop circuit 103 is used as read data (RD) of the system circuit.

The DLL circuit 101 generates a second delay signal (not illustrated in FIG. 1) with a phase that differs from the phase of the delay signal DQSd by 180 degree. The memory controller includes a flip-flop circuit for latching the data DQ by the second delayed strobe signal. The flip-flop circuit and the above described flip-flop circuits 102 and 103 receive data that is output substantially in synchronization with a rising edge and a falling edge of the data strobe signal DQS.

According to the above described configuration, the system circuit receives an input signal, such as the data DQ, substantially in synchronization with a rising edge and a falling edge of the data strobe signal DQS. The memory outputs the data DQ substantially in synchronization with the data strobe signal DQS. The flip-flop circuit 102 receives the data DQ by setting a delay time of the DLL circuit 101 to a ¼ (90 degree out of phase) of the data strobe signal DQS, and thereby adjusting a timing to receive the data DQ by the delay signal DQSd to a center of a period during which the data DQ is valid (a pulse center).

A delay time of a wiring for each circuit (each chip) may vary with variations in forming a system circuit. In this case, an arrival time of the delay signal DQSd and an arrival time of the data DQ to the flip-flop circuit 102 differ. In other words, an edge timing of the delay signal DQSd deviates from the center of the period in which the data DQ is valid. The differences of the timings of the data DQ and the delay signal DQSd makes the flip-flop circuits 102 and 103 latch wrong data. This may cause an error in the read data RD because the period in which the data DQ is valid is short in a system circuit with a high transfer speed.

Thus, some circuits included in a system circuit may perform a training operation (timing calibration) for adjusting a delay time by changing a delay time of the DLL circuit 101 at an activation and repeating operation to read data with a given value (for example, see Japanese Laid-open Patent Publication No. 2003-91453).

A relative difference of timing between the data DQ and the delay signal DQSd may also be caused by a change in environmental temperature of the system circuit and a change of an operation power supply voltage of the system circuit. The differences of timings cause an error in the read data RD. Executing a training operation again causes an overhead for read and write operation in the system circuit that accesses the memory.

SUMMARY

According to an aspect of the embodiments, a timing adjustment device includes a plurality of receive circuits that receive an input signal based on mutually different timings, a determination circuit that determines a first transition and a second transition of the input signal based on a received result by receive circuits, among the plurality of receive circuits, that receive the input signal with adjacent timings among the plurality of different timing of the receive circuits, and an adjustment circuit that adjusts the receiving timing of the input signal so that the receiving timing of the input signal becomes close to a central timing of a period according to the first transition and the second transition.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9 illustrates an example of calculation processing of a central position according to the first embodiment;

FIG. 11 illustrates an example of calculation processing of a central position according to the second embodiment;

FIG. 13 illustrates an example of data determination processing according to the third embodiment.

DESCRIPTION OF THE EMBODIMENTS

Figure 1:
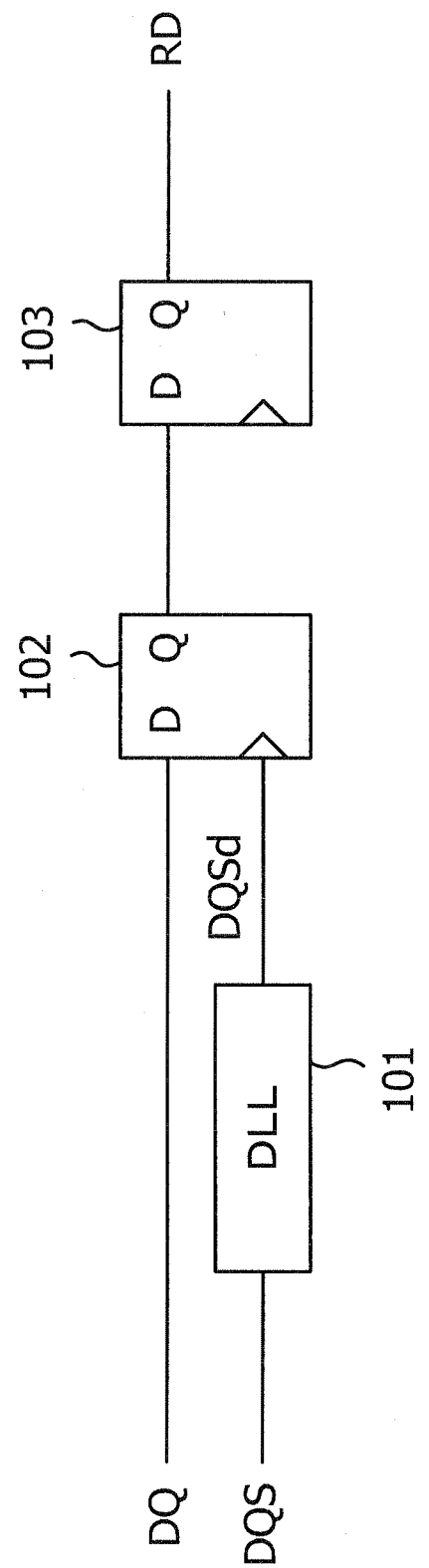
FIG. 1 illustrates a conventional interface circuit.
Figure 2:
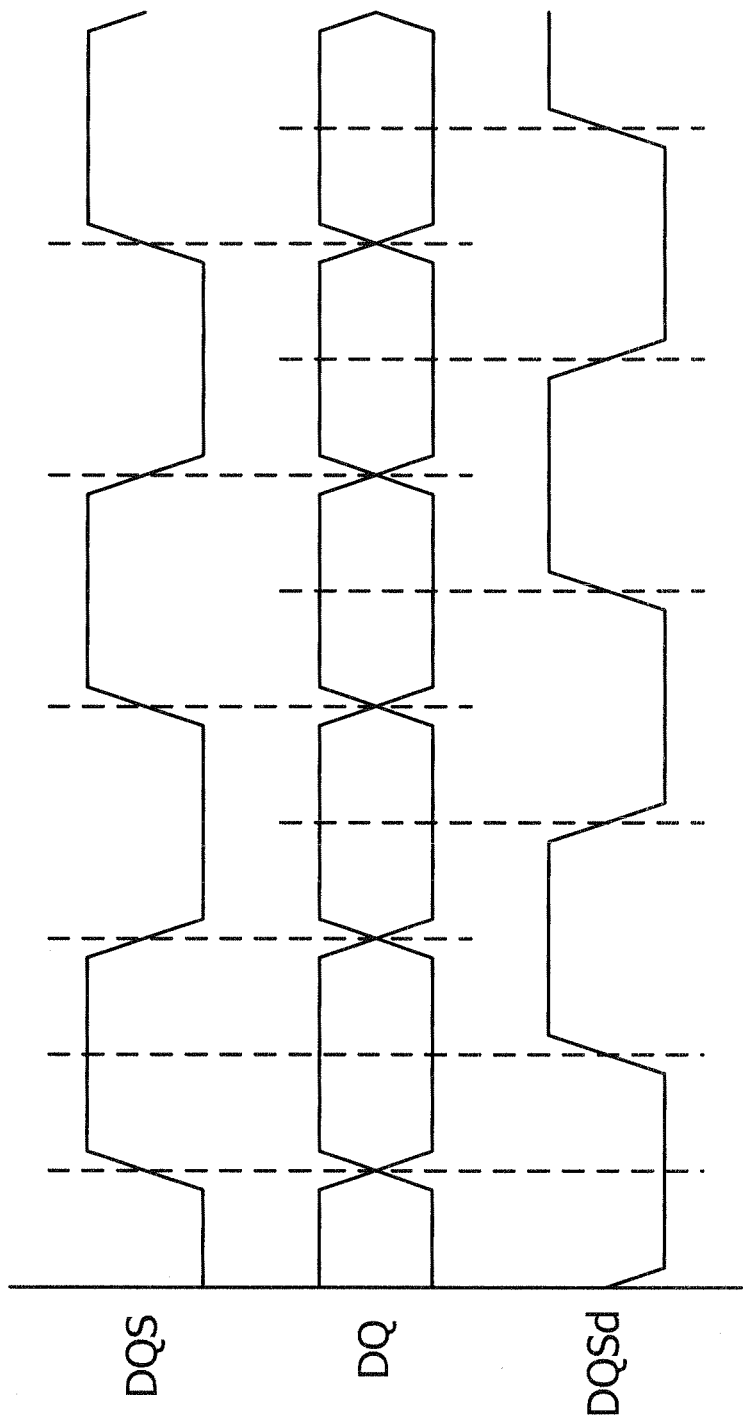
FIG. 2 illustrates an operation waveform of the conventional interface circuit of FIG. 1.
Figure 3:
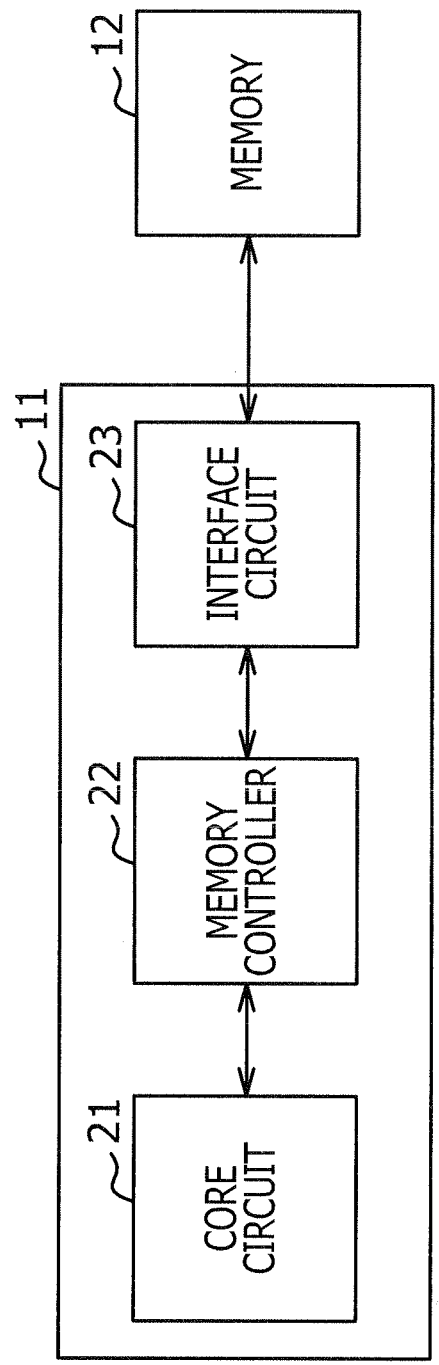
FIG. 3 illustrates a system configuration related to an embodiment.

FIG. 3 illustrates a system related to the first embodiment. The system includes a system circuit 11 and a memory 12. The system circuit 11 is one example of a "system device." The memory 12 is one example of a "target circuit." The system circuit 11 is, for example, one chip (for example, a semiconductor integrated circuit device with Large Scale Integration) and includes a core logical circuit 21 (hereinafter, simply referred to as a "core circuit"), a memory controller 22, and an interface circuit 23. The memory 12 is a synchronization type semiconductor device, for example, a Double Data Rate Synchronous Dynamic Random Access Memory (DDR-SDRAM).

The core circuit 21 is, for example, a central processing unit (CPU), and outputs a read request for reading data in the memory 12 and an address to which the data is stored in the memory 12. The core circuit 21 outputs a write request for writing data to the memory 12 and an address for storing the data to the memory controller 22.

In response to the request from the core circuit 21, the memory controller 22 accesses the memory 12 through the interface circuit 23. For example, a request from the core circuit 21 may be a write access. In this case, the controller 22 supplies a command, an address, and data to the memory 12 through the interface circuit 23. The memory 12 stores the data to the address. When a request from the core circuit 21 is a read request, the controller 22 outputs data read from the memory 12 to the core circuit 21 through the interface circuit 23.

Figure 4:
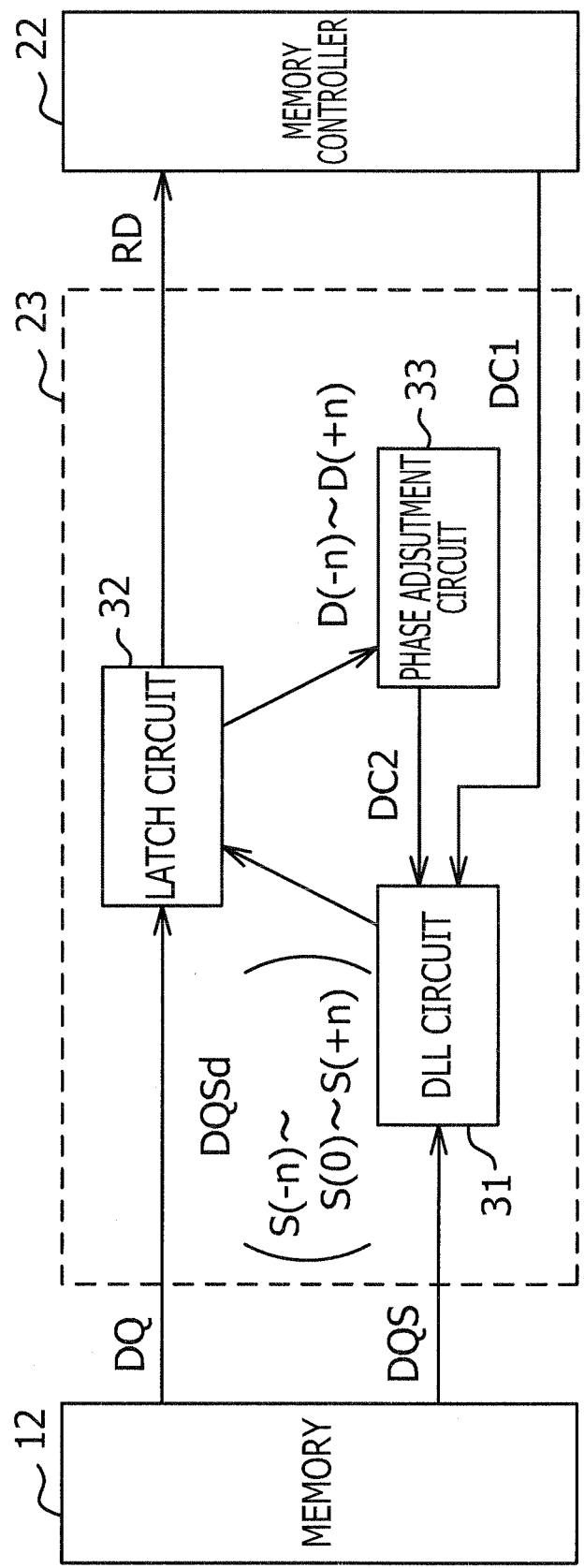
FIG. 4 illustrates a configuration of the interface circuit of FIG. 3.

As illustrated in FIG. 4, the memory 12 and the interface circuit 23 are configured so that data DQ is sent and received with a data strobe signal DQS. The interface circuit 23 that is interposed between the memory 12 and the memory controller 22 is called a physical layer circuit (DDR-PHY).

The interface circuit 23 includes a Delay Locked Loop (DLL) circuit (hereinafter, referred to as a DLL circuit) 31, a latch circuit 32, and a phase adjustment circuit 33.

The DLL circuit 31 generates a delayed data strobe signal (hereinafter, simply referred to as a "delay signal") DQSd by delaying a data strobe signal DQS. The delay signal DQSd includes a plurality of delayed data strobe signals (delay signals).

Figure 5:
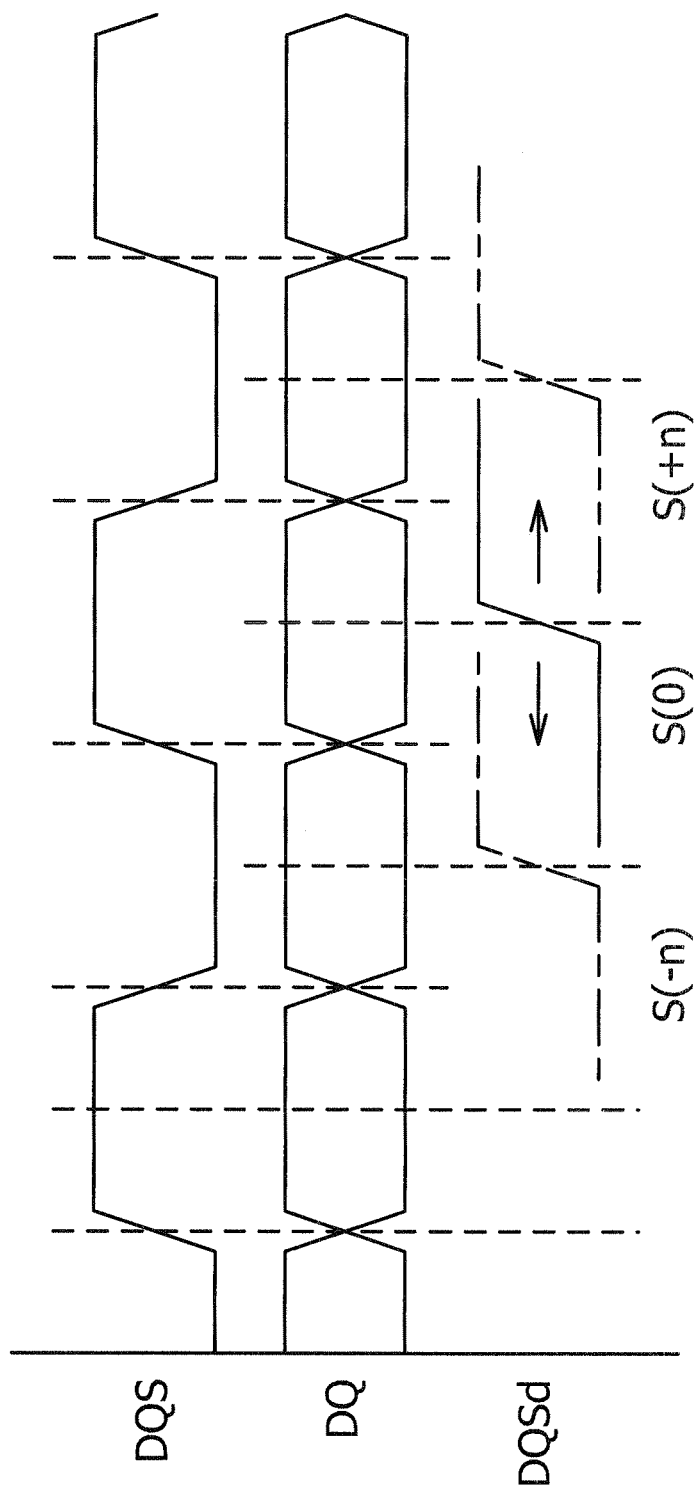
FIG. 5 illustrates an operation waveform of the DLL circuit of FIG. 4.

According to the embodiment, as illustrated in FIG. 5, the delay signal DQSd includes, assuming a reference delay signal S (0) as a center, a plurality of (the number of n) delay signals S (+1) to S (+n) the phases of which are delayed from the reference delay signal S (0), and a plurality of (the number of n) delay signals S (−n) to S (−1) the phases of which are advanced from the reference delay signal S (0). Each of the delay signals S (−n) to S (0) to S (+n) may have different phase.

Each of the delay signals S (−n) to S (+n) can be obtained by delaying the data strobe signal DQS. In this situation, the waveforms of the obtained delay signals are substantially the same as the waveform of the signal DQS. Hence, each of the delay signals S (−n) to S (+n) transitions with a timing according to each of the phases. In other words, the DLL circuit 31 generates a plurality of delay signals S (−n) to S (+n) with different timings. The DLL circuit 31 generates each of the delay signals S (−n) to S (+n) by assuming the reference delay signal S (0) as a center. Therefore, a timing of a reference delay signal S (0) is a center of the plurality of the delay signals (−n) to S (+n).

The number n indicates a number from the timing of the reference delay signal S (0) (central timing) to each of the delay signals. The number n also may indicate a phase difference (timing difference) between the reference delay signal S (0) and other delay signals S (−n) to S (−1), and S (+1) to S (+n). +/− signs that preceding the numbers or symbols indicate whether a delay signal is advanced or delayed from the reference delay signal S (0), in other words, they indicate whether the timing is earlier or later than the reference delay signal S (0).

A phase difference between a delay signal with the most delayed phase (the most delayed signal) S (+n) and a delay signal with the most advanced phase S (−n) may be set according to, for example, a time corresponding to one data unit DQ, for example, a pulse width of the data DQ. The memory 12 outputs data DQ substantially in synchronization with a rising edge and a falling edge of a data strobe signal DQS. Accordingly, a pulse width of data DQ of 1 or 0 corresponds to a time from the rising edge to the falling edge of the data strobe signal DQS. In order to latch data DQ correctly, it is desirable that latching be performed at a center of a pulse of 1 or 0. This means that an edge of a signal that is obtained by delaying the data strobe signal DQS, in other words, it is desirable that a timing in which a signal transitions be adjusted to a center of the pulse.

When the same data, for example, 1 is consecutive in data, a center of the pulse of one data unit DQ may not be detected because the data DQ becomes an H level during the period in which 1 is consecutive in the data. Therefore, the center of the pulse of the data DQ of 1 or 0 may be detected when data string transferred as time passes, becomes 010 or 101. In the data string, a pulse width when the data DQ is 1 or 0 becomes a half of a cycle of the data strobe signal DQS.

In order to detect a pulse of 1, it is desirable that the data DQ be sampled for a period longer than a period in which the data DQ transitions, in other words, from a timing in which the data DQ transitions from an L level to an H level and a timing the data DQ transitions from the H level to the L level. A pulse width of 1 and 0 may be varied according to properties (wire and circuit delays, a balance of a circuit output unit, and a threshold level, etc.) over a route in which data DQ is transmitted. A pulse width of data DQ may become shorter than a half of a cycle of the data strobe signal DQS due to the variation. Hence, by taking the difference between the delay times of the data DQ and the data strobe signal DQS and the above described variations (wire delay and temperature variation etc.) into consideration, a phase difference between the delay signal S (+n) with the most delayed phase and the delay signal (−n) with the most advanced phase is set so that a rising edge and a falling edge of the data DQ may be detected by including a pulse of the one data unit DQ. According to the embodiment, as an example, a phase difference is set to 360 degree. In other words, the DLL circuit 31 according to the embodiment generates a plurality of delay signals S (−n) to S (+n) within a phase width of 360 degree.

The number of delay signals (2n+1) generated by the DLL circuit 31 corresponds to the number (2n) that divides the above described phase difference and is set so that one of the delay signals corresponds to a center of data eye of the data DQ (a period in which 1 or 0 is established) according to a configuration of the DLL circuit 31. The memory controller 22 supplies a setting code DC1 to the DLL circuit 31. A phase adjustment circuit 33, which will be described later, supplies a setting code DC2 to the DLL circuit 31. The DLL circuit 31 generates each of the delay signals S (−n) to S (0) to S (+n) so that delay times according to the setting codes DC1 and DC2 are set to a central timing of the delay signal DQSd for the timing of data strobe signal DQS, in other words, a delay time of a reference delay signal S (0).

The latch circuit 32 includes a plurality of latches (the number of (2n+1)) corresponding to a plurality of delay signals S (−n) to S (0) to S (+n), and latches the data DQ by each of the delay signals S (−n) to S (0) to S (+n). The latch circuit 32 outputs a signal based on the data obtained by latching the data DQ by the reference delay signal S (0) as a read data RDa. The latch circuit 32 outputs a plurality of latch data D (−n) to D (+n) obtained by latching data DQ by each of the delay signals S (−n) to S (+n). The latched circuit 32 is one example of a data receive circuit.

The above described memory controller 22 is configured to perform the training operation of the data strobe signal DQS with a given timing. The given timing may be the period in which the core circuit 21 does not access to the memory 12 such as during an initialization process performed after turning on the power, and a certain period after a power on reset signal is input.

One example of the training operation will now be described. Of the above described delay signals S (−n) to S (0) to S (+n), only the reference delay signal S (0) may be relevant to the operation of the memory controller 22. Because of this, the reference delay signal will be described.

The memory controller 22 writes given data Td to a given address A1 in the memory 12. The memory controller 22 supplies a given setting code to the DLL circuit 31. The DLL circuit 31 generates a reference delay signal S (0) that is delayed from the data strobe signal DQS for a time according to the setting code.

The controller 22 reads the data Td (read data RDa) from the address A1 in the memory 12 and supplies the setting code to the DLL circuit 31 so as to change (for example, increase) the delay time of the reference delay signal S (0). Data Td that is taken in by timings corresponding to a plurality of delay times is stored by repetitions of reading the data Td and changing the delay time of the reference delay signal S (0). The data Td indicates a pulse waveform according to a logic level of the data Td by changing the receiving timing. Hence, based on the pulse waveform, the controller 22 detects a timing corresponding to a center of a pulse of the data Td or, in other words, to a setting code DC1. The controller 22 supplies the detected setting code DC1 to the DLL circuit 31.

The DLL circuit 31 stores the setting code DC1 supplied from the controller 22 and generates a delay signal S (0). In other words, each of the delay signals S (−n) to S (+n) are delayed by a delay time (timing) according to the setting code DC1. The differences of timings of delay signals DQSd generated by the DLL circuit 31 for the data DQ is corrected by the above described training operation by the controller 22. This training operation may not be executed while the core circuit 21 illustrated in FIG. 3 performs read operation because the training operation is performed by reading the data Td from the memory 12 while changing the delay time. In other words, the memory controller 22 performs the above described training operation while the core circuit 21 does not perform the read operation to the memory 12.

The phase adjustment circuit 33 illustrated in FIG. 4 detects a central phase in valid latch data among the plurality of latch data D (−n) to D (+n). The phase adjustment circuit 33 generates a setting code DC2 so that timing of the reference delay signal S (0) becomes close to the detected central timing and supplies the setting code DC2 to the DLL circuit 31. The DLL circuit 31 generates delay signals S (−n) to S (+n) by a delay time (timing) according to the setting code DC2. In other words, the phase adjustment circuit 33 adjusts the delay time of the DLL circuit 31 so that the timing of the reference delay signal S (0) becomes close to the detected central timing. The phase adjustment circuit 33 is one example of a timing adjustment device, a determination circuit, and an adjustment circuit.

Valid latch data D (−n) to D (+n) is a signal by which a center of a pulse of data DQ may be determined. Levels of the plurality of the latch data D (−n) to D (+n) are levels in which data DQ is taken in at different timings each other. Thus, the levels of the latch data D (−n) to D (+n) correspond to changes in levels of data DQ. As described above, a signal train of data DQ by which a center of a pulse may be determined, in other words, change in waveform is 010 or 101. This means that the waveform of data DQ in a receiving period by the plurality of delay signals S (−n) to S (+n) includes a transition from 0 to 1 (a first transition) and a transition from 1 to 0 (a second transition). Hence, the phase adjustment circuit 33 determines latch data D (−n) to D (+n) in which the first transition and the second transition exist to be valid and latch data D (−n) to D (+n) in which one of the first and the second transition exist, or none of them exist, to be invalid.

Existence or non existence of the above described transition may be determined by signal levels with the adjacent timings to receive data D (−n) to D (+n). In other words, the latch circuit 32 generates latch data D (−n) to D (+n) by latching data DQ by delay signals S (−n) to S (+n) with different phases. Therefore, when a signal level of the data DQ changes, levels of two latch signals with the adjacent timings are different. Thus, existence of a transition between the timings may be determined when signal levels of two latch signals with adjacent timings are compared, and the signal levels are different.

The interval between the first and the second transitions correspond to a pulse width of data DQ, 1 or 0. Accordingly, the phase adjustment circuit 33 determines the first transition and the second transition in the latch data D (−n) to D (+n), and detects a central timing of a period according to the first transition and the second transition. The phase adjustment circuit 33 adjusts a timing of each of the delay signals S (−n) to S (+n), in other words, delay time of the DLL circuit 31 so that the central timing of the delay signals S (−n) to S (+n), in other words, the timing of the reference delay signal S (0) becomes close to the central timing of the period.

The latch circuit 32 outputs read data RDa by latching data DQ with the adjusted reference delay signal S (0). As described above, the timing of the reference delay signal S (0) is adjusted so that the timing of the reference delay signal S (0) becomes close to the central timing of a pulse of data DQ read from the memory 12, thus the difference of phases generated between the data DQ and data strobe signal DQS may be reduced.

The phase adjustment circuit 33 determines the first transition and the second transition of the data DQ. The data DQ read from the memory 12 in response to a request from the core circuit 21 may be data in which the same level continues, or data in which signal levels are randomly changed. The phase adjustment circuit 33 determines a first transition and a second transition of data DQ in which signal levels are randomly changed and adjusts a central timing of the delay signal DQSd (timing of reference delay signal S (0)) generated by the DLL circuit 31 based on a central timing of a period according to the first transition and the second transition. Thus, when the core circuit 21 reads data DQ from the memory 12, timing of the delay signal DQSd may be adjusted by using the read data DQ. Accordingly there is no need to suppress (stop) read operation of the core circuit 21 in order to adjust timing, and thereby overhead for reading data from the memory 12 may be reduced.

Configuration of the DLL circuit 31, the latch circuit 32, and the phase adjustment circuit 33 illustrated in FIG. 4 will be described.

The number of above described delay signals is assumed to be 3 for convenience of the description and the drawings. Thus, the DLL circuit 31 according to the embodiment generates seven delay signals S (−3) to S (0) to S (+3) with different phases (timings) to each other.

Figure 6A:
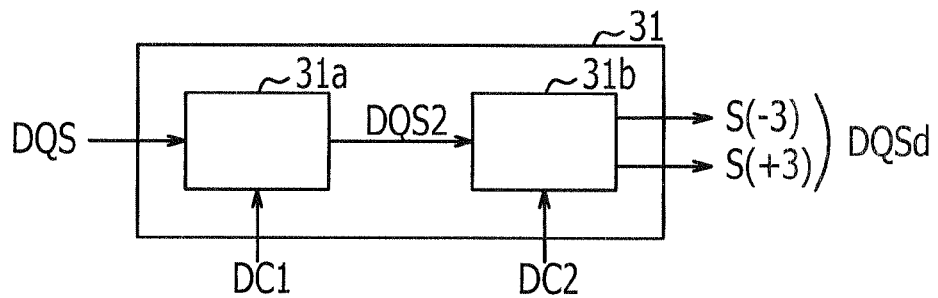
FIG. 6A and FIG. 6B illustrate an example of the DLL circuit of FIG. 4.

As illustrated in FIG. 6A, the DLL circuit 31 includes a delay unit 31a and a DLL unit 31b.

The delay unit 31a generates a delay signal DQS2 based on a data strobe signal DQS. Moreover, the delay unit 31a sets a delay time of the delay signal DQS2 for the data strobe signal DQS to a time according to a setting code DC1 supplied from the memory controller 22 (refer to FIG. 4). In other words, the delay unit 31a generates a delay signal DQS2 by delaying the data strobe signal DQS for a time according to the setting code DC1.

The DLL unit 31b generates delay signals S (−3) to S (+3) with different phases, in other words, timings each other. Moreover, the DLL unit 31b sets a delay time of the reference delay signal S (0) for the delay signal DQS2 to a time according to a setting code DC 2 supplied from the phase adjustment circuit 33 (refer to FIG. 4).

Figure 6B:
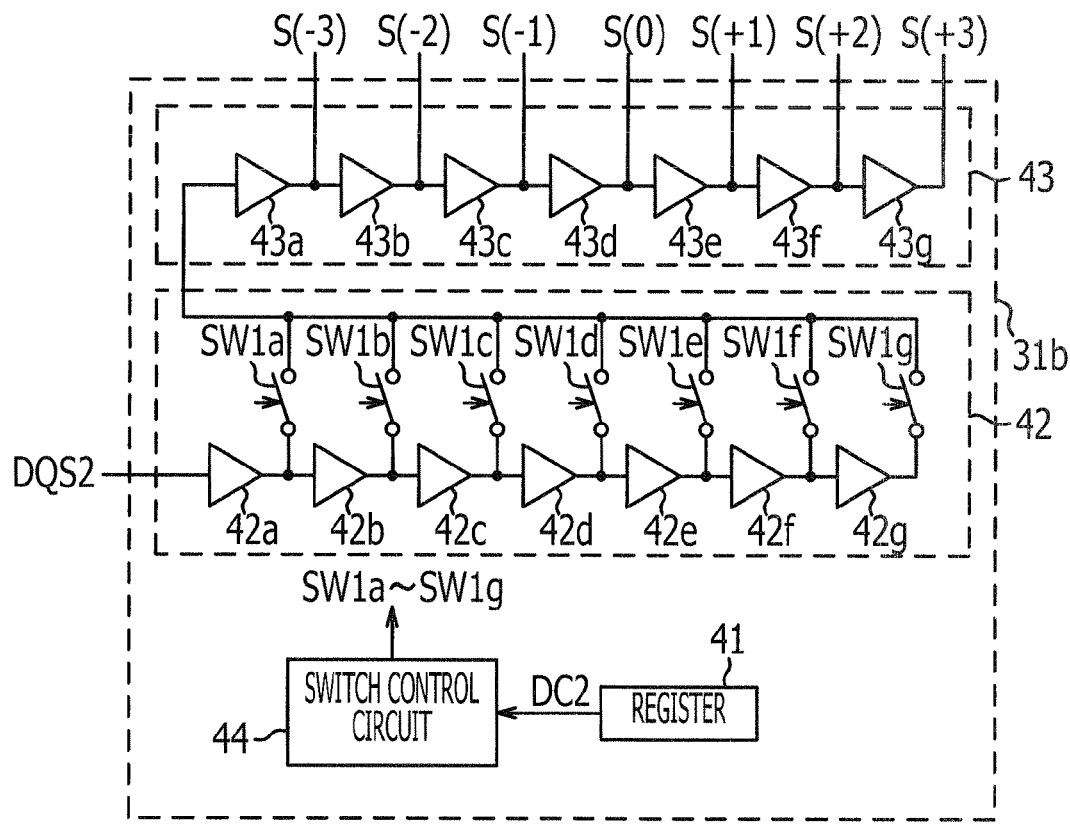

As illustrated in FIG. 6B, the DLL unit 31b includes a register 41, delay circuits 42 and 43, and a switch control circuit 44.

The first delay circuit 42 includes a plurality of delay elements 42a to 42g, and a plurality of switches SW1a to SW1g. The plurality of delay elements 42a to 42g are serially coupled, in other words, output terminals of each of the delay elements 42a to 42f are coupled to input terminals of the delay elements 42b to 42g respectively. A data strobe signal DQS is input to the delay element 42a in a first stage. First terminals of the switches SW1a to SW1g are coupled to output terminals of each of the delay elements 42a to 42g, and second terminals of each of the switches SW1a to SW1g are coupled each other and the coupling points are coupled to the second delay circuit 43.

Each of the delay elements 42a to 42g includes, for example, an even number of serially coupled inverter circuits and outputs a signal by delaying the input signal. The delay time of an output signal for an input signal is based on a configuration of delay elements 42a to 42g. The switch SW1a to SW1g are, for example, n-channel MOS transistors or analogue switches with CMOS structure, and is turned on and off in response to a signal supplied from the switch control circuit 44.

The switch control circuit 44 turns on one of switches among the plurality of switches SW1a to SW1g that corresponds to a setting code DC2 stored in the register 41 and turns off the remaining switches. Therefore, the first delay circuit 42 generates a delay signal DDQS that is obtained by adding a delay according to the number of stages of the delay elements to the turned on switch to the data strobe signal DQS by turning on one switch according to the value of the register 41.

The second delay circuit 43 includes a plurality of delay elements 43a to 43g (seven). The delay elements 43a to 43g are serially coupled, in other words, output terminals of each of the delay elements 43a to 43f are coupled to input terminals of each of the delay elements 43b to 43g. The delay element 43a in the first stage is supplied with the delay signal DDQS generated by the first delay circuit 42. Each of the delay elements 43a to 43g includes, for example, an even number of serially coupled inverter circuits and outputs a signal by delaying an input signal. The delay time of the output signal for the input signal is based on a configuration of delay elements 43a to 43g. Each of the delay elements 43a to 43g outputs delay signals S (−3) to S (+3).

As described above, the switch control circuit 44 turns on one of the switches according to a setting code DC2 stored in the register 41. By storing the changed setting code DC2 in the register 41, the delay signal DQS2, in other words, the delay signal DDQS for the data strobe signal DQS is changed. Accordingly, the DLL unit 31b adjusts a delay time of the reference delay signal S (0) for the delay signal DQS2 according to the setting code DC2 and generates a plurality of delay signals S (−3) to S (+3) that includes the delay signal S (0). Hence, by changing the setting code DC2, a phase difference of each of the delay signals S (−3) to S (+3) for the data strobe signal DQS, in other words, a timing of each of the delay signals S (−3) to S (+3) may be changed.

Figure 7:
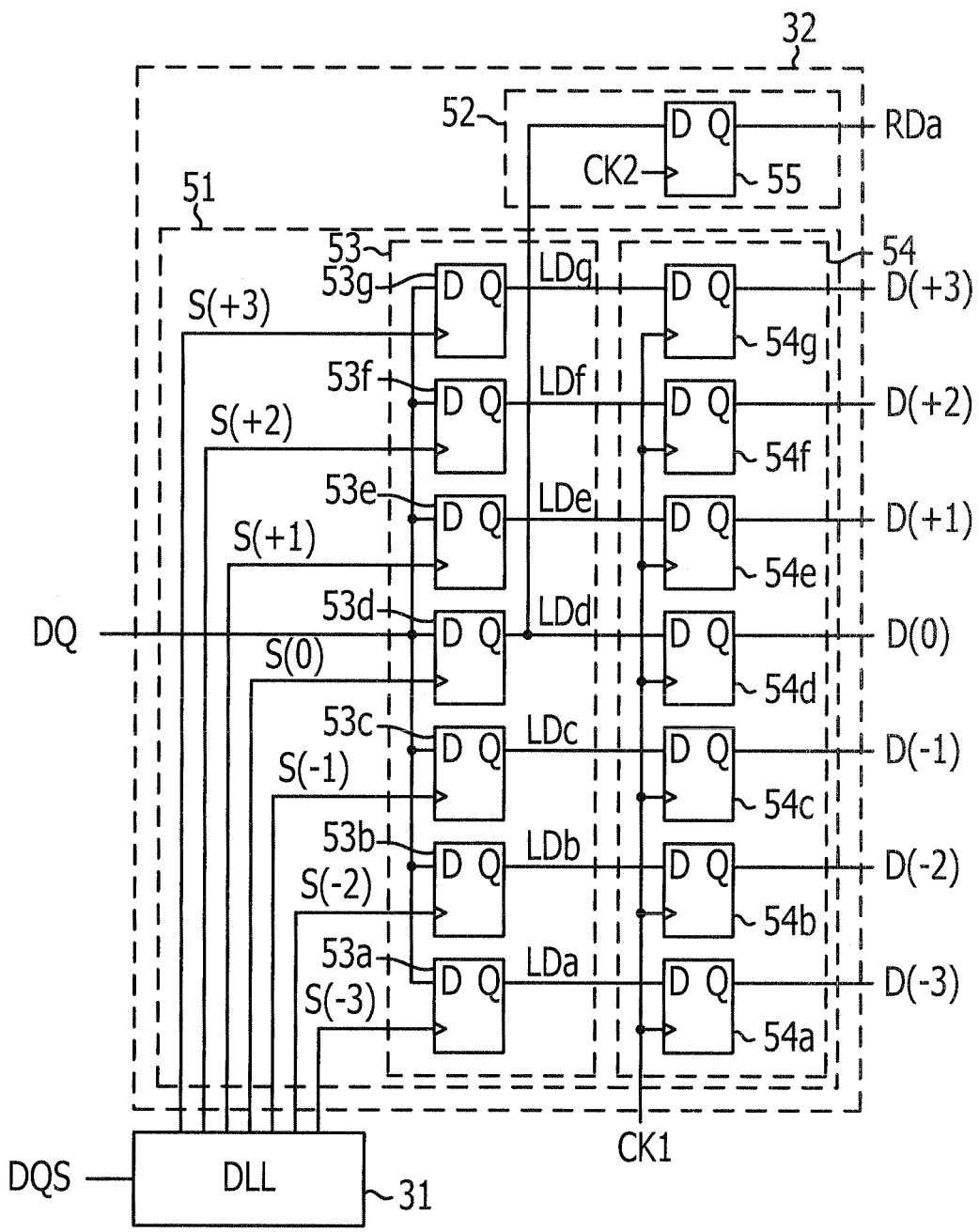
FIG. 7 illustrates an example of a latch circuit of FIG. 4.

As illustrated in FIG. 7, the latch circuit 32 of FIG. 4 includes latch circuits 51 and 52. The first latch circuit 51 generates latch data D (−3) to D (+3) in response to delay signals S (−3) to S (+3). The second latch circuit 52 generates read data RDa in response to the reference delay signal (0).

The first latch circuit 51 includes a latch unit 53 that latches data DQ by the plurality of delay signals S (−3) to S (+3) with different phases (timings) each other and a latch unit 54 for passing the data latched by the latch unit 53 to the phase adjustment circuit 33 (refer to FIG. 4).

The first latch unit 53 includes a plurality of (seven) flip-flop circuits (hereinafter, called FF circuits) that corresponds to delay signals (−3) to S (+3). Data DQ is supplied to a data terminal D of the FF circuit 53a and a corresponding delay signal S (−3) is supplied to a clock terminal of the FF circuit 53a. In response to the delay signal S (−3), the FF circuit 53a latches data DQ substantially in synchronization with a rising edge of the delay signal (−3) and outputs latch data LDa with a level substantially equivalent to the latch level from an output terminal Q. Likewise, each of the FF circuits 53b to 53g latches data DQ that is supplied to a data terminal D substantially in synchronization with a rising edge of the corresponding delay signals S (−2) to S (+3), and outputs latch data LDb to LDg with a level substantially equivalent to the latch level respectively.

The second latch unit 54 includes a plurality of (seven) FF circuits 54a to 54G that correspond to the latch data LDa to LDg generated by the first latch unit 53. A data terminal D of the FF circuit 54a is supplied with corresponding latch data LDa and a clock terminal is supplied with a clock signal CK1.

The clock signal CK1 is supplied, for example, from a circuit that receives latch data D (−3) to D (+3) and processes each latch data, in other words, the phase adjustment circuit 33 illustrated in FIG. 4. The phase adjustment circuit 33 generates the first clock signal CK1 so that the latch data LDa to LDg generated by the first latch unit 53 is taken in based on the reference delay signal S (0). For example, the phase adjustment circuit 33 generates a clock signal CK1 with the frequency substantially the same as the reference delay signal S (0) and delayed for a given time from the signal S (0). The delay time of the clock signal CK1 for the reference delay signal S (0) is set so that an output signal of the FF circuit 53d that latches data DQ in response to the reference delay signal S (0) is latched by the FF circuit 54d.

The FF circuit 54a latches the latch data LDa substantially in synchronization with a rising edge of the clock signal CK1 in response to the clock signal CK1 and outputs latch data D (−3) with substantially the same level as the latch level from the output terminal Q. Similarly, each of the FF circuits 54b to 54g latches latch data LDb to LDg supplied to each of the data terminals D substantially in synchronization with a rising edge of the clock signal CK1 and outputs latch data D (−2) to D (+3) with a level substantially the same as the latch level respectively. The configuration of the above described second latch unit 54 is just one of a number of examples, and a timing that each of the FF circuit 54a to 55g latches a signal is adjusted according to timings of output signals of the FF circuits 53a to 53g in the preceding stage.

The second latch circuit 52 includes a FF circuit 55. A clock signal CK2 is supplied to a clock terminal of the FF circuit 55 and a latch signal LDd of the FF circuit 53d of the first latch unit 53 is supplied to a data terminal D of the FF circuit 55. The clock signal CK2 is supplied to the clock terminal of the FF circuit 55 from a circuit that receives read data RDa and processes the read data RDa, for example, the memory controller 22 illustrated in FIG. 4. The memory controller 22 generates a clock signal CK2 with a frequency that is substantially the same as the frequency of the reference delay signal S (0) and that is delayed from the reference delay signal S (0) for a given time based on the reference delay signal S (0). The delay time of the clock signal CK2 for the reference delay signal S (0) is set so that an output signal of the FF circuit 53d that latches data DQ in response to the reference delay signal S (0) is latched by the FF circuit 55. The FF circuit 55 latches the output signal of the FF circuit 53d (latch data LDd) that responds to the reference delay signal S (0) substantially in synchronization with a rising edge of the clock signal CK2 and outputs read data RDa with the latched level.

Although not illustrated, the latch circuit 32 includes a FF circuit that latches data DQ substantially in synchronization with a falling edge of the reference delay signal S (0), and a FF circuit that generates read data by latching an output signal of the FF circuit with a clock signal CK2. With the FF circuits and the above described FF circuits 53d and 55, data DQ that is output substantially in synchronization with a rising edge and a falling edge of data strobe signal DQS is taken into an internal circuit (for example, the memory controller 22). The DLL unit 31b generates an inverting delay signal with a phase that is different from the phase of the reference delay signal S (0) by 180 degree, latches data substantially in synchronization with a rising edge of the inverting delay signal, and data that is obtained by further latching the latched data with the clock signal CK2 may be assumed as read data.

Figure 8:
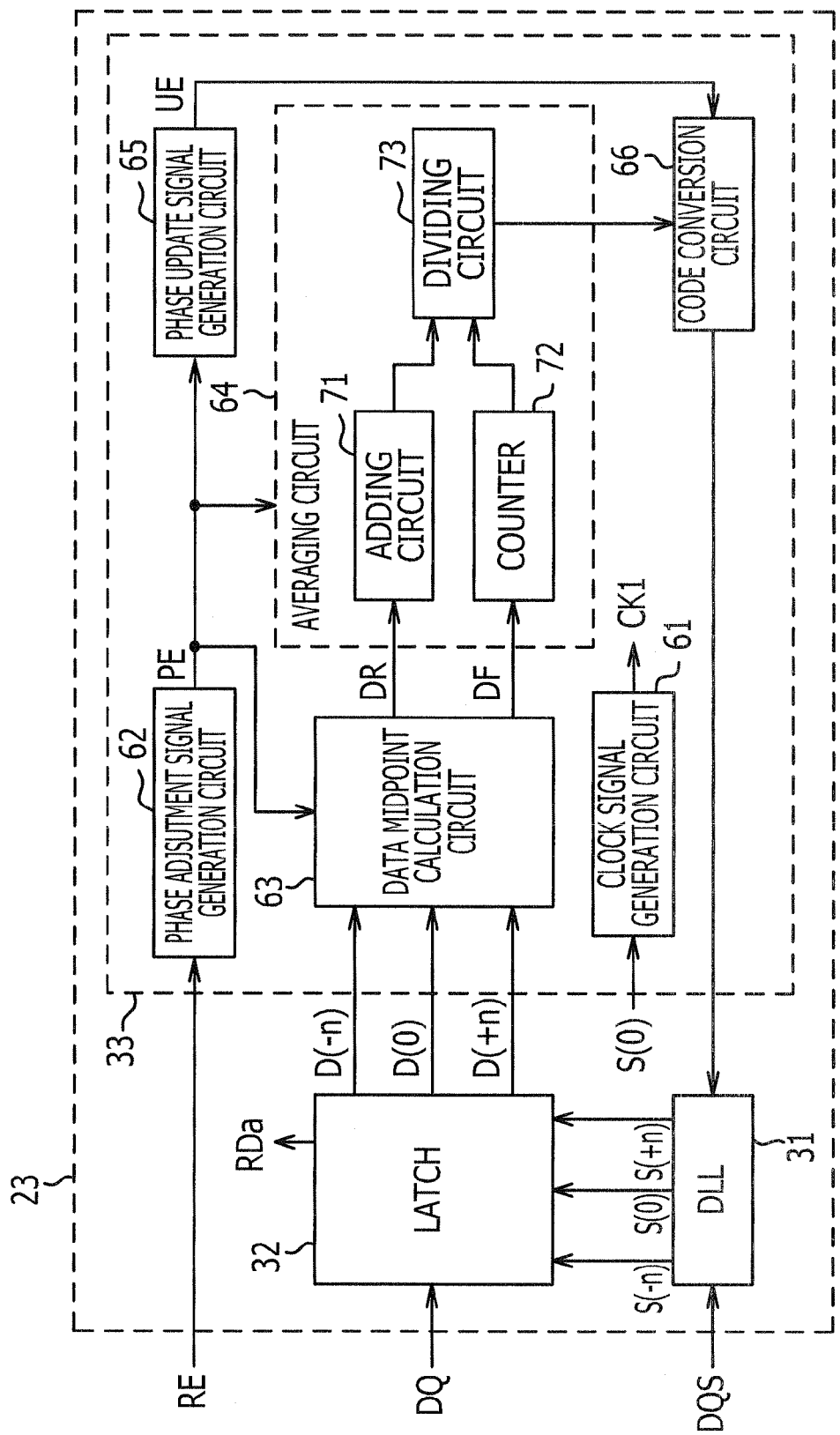
FIG. 8 illustrates a phase adjustment circuit of FIG. 4 according to a first embodiment.

As illustrated in FIG. 8, the phase adjustment circuit 33 of FIG. 4 includes a clock signal generation circuit 61, a phase adjustment signal generation circuit 62, a data midpoint calculation circuit 63, an averaging circuit 64, a phase update signal generation circuit 65, and a code conversion circuit 66.

The clock signal generation circuit 61 generates the above described clock signal CK1. For example, the clock signal generation circuit 61 generates the clock signal CK1 based on a data strobe signal DQS. The clock signal CK1 is supplied to the above described latch circuit 32 and each of the circuits 62 to 66 that are included in the phase adjustment circuit 33. Hence, the circuits 62 to 66 that are included in the phase adjustment circuit 33 operate substantially in synchronization with each other based on the clock signal CK1. The clock signal generation circuit 61 may be removed by supplying the clock signal CK1 from the external of the phase adjustment circuit 33.

The phase adjustment signal generation circuit 62 generates an activation signal PE based on a read enable signal RE. For example, the phase adjustment signal generation circuit 62 generates the activation signal PE by buffering the signal RE. The activation signals PE are supplied to each of the circuits 63 to 65. The read enable signal RE indicates when the core circuit 21 illustrated in FIG. 3 reads data DQ from the memory 12, and for example, the read enable signal RE becomes an H level when reading data DQ and other than that becomes an L level.

The data midpoint calculation circuit 63 and the averaging circuit 64 activate in response to an H level activation signal PE and inactivate in response to an L level activation signal. By activating circuits 63 and 64 when reading data DQ, and by inactivating the circuits 63 and 64 in the rest of the time, a phase of the DLL unit 31b is adjusted based on data DQ that is output from the memory 12. As illustrated in FIG. 4, the memory 12 and the interface circuit 23 send and receive data DQ by the data strobe signal DQS. In other words, the interface circuit 23 outputs data DQ that is write data written to the memory 12 together with the data strobe signal DQS. Accordingly, a signal line that transmits the data strobe signal DQS and the data DQ is used as a bidirectional bus. Thus, the phase of the data strobe signal DQS for the data DQ is adjusted when reading the data DQ from the memory 12 based on a read enable signal RE by activating each of the circuits 63 and 64, a difference of phases between the data DQ and the data strobe signal DQS is reduced, and thereby an error in determination of the read data RDa is reduced. Current consumption is reduced by inactivating each of the circuits 63 and 64.

The data midpoint calculation circuit 63 sequentially receives latch data D (−3) to D (+3) that is output from the latch circuit 32 substantially in synchronization with, for example, a rising edge of the clock signal CK1. The data midpoint calculation circuit 63 determines whether the received latch data D (−3) to D (+3) is valid or invalid. The valid data is, as described above, data in which a first transition and a second transition exist. The data midpoint calculation circuit 63 outputs a data flag DF according to the determination result. For example, the data midpoint calculation circuit 63 outputs a logic 1 (H level) data flag DF when the latch data D (−3) to D (+3) is determined to be valid, whereas the data midpoint calculation circuit 63 outputs a logic 0 (L level) data flag DF when the latch data is determined to be invalid.

The data midpoint calculation circuit 63 calculates a central timing of the latch data D (−3) to D (+3) that is determined to be valid. For example, the data midpoint calculation circuit 63 calculates an average value of numbers of the latch data included between the first transition and the second transition and assumes the average value as a central timing (hereinafter, referred to as a period central value) DR of a period according to the first transition and the second transition. The data midpoint calculation circuit 63 performs calculation process according to a setting for controllability etc. based on the calculated average value and the processed value is assumed to be a period central value DR. According to timings of the first transition and the second transition, the average value may include a value smaller than one. At this time, the data midpoint calculation circuit 63 rounds up the value smaller than one to make an integer value and the obtained value is assumed to be a period central value DR. By rounding up, when the period central value DR is other than 0, in other words, even when the period central value DR is slightly differs from the reference delay signal D(S), the difference is corrected. In other words, high responsiveness for a timing difference between the delay signal DQSd and the reference delay signal S may be achieved. Hence, the period central value DR may be adjusted to the reference delay signal (S) accurately, and thereby it is effective when outputting data DQ with a shorter pulse width.

FIG. 9 illustrates a pattern example of latch data. In FIG. 9, values surrounded by the dotted lines indicate data level latched with a timing of a period according to the first transition and the second transition.

For example, in the pattern 1, values between the latch data D (−2) and the latch data D (−1) differ, thus the first transition exists between the two values. Moreover, values between the latch data D (+1) and the latch data D (+2) differ, thus the second transition exists between the two values. Accordingly, the data midpoint calculation circuit 63 calculates a period central value DR (=0) based on the latch data D (−1) to D (+1) of a period according to the first transition and the second transition.

In the pattern 6, values of the latch data D (0) and the latch data D (+1) differ, and thereby the second transition exists between the two values. Moreover, values between the latch data D (+2) and the latch data D (+3) differ, thus the first transition exists between the two values. Accordingly, the data midpoint calculation circuit 63 calculates a period central value DR (=+2) based on latch data D (+1) to D (+2) of a period according to the first transition and the second transition. The period central value DR may be +1. The period central value DR may be an intermediate value between +1 and +2, for example, +1.5. The pattern may assume to be invalid when the period central value is a decimal number.

Moreover, the pattern 7 does not include any transition, and the pattern 9 includes one transition. Thus, the data midpoint calculation circuit 63 determines latch data in the patterns as invalid and outputs data flag DF of 0. The data midpoint calculation circuit 63 cancels the calculation processing of the central period and outputs a period central value DR, 0.

The data midpoint calculation circuit 63 outputs the period central value DR of 0 even when the calculation result of the central period is 0. In this case, the data midpoint calculation circuit 63 outputs a data flag DF of 1. Thus, the data flag DF allows indicating whether the period central value DR is valid or invalid.

The pattern 8 includes four transitions. The discontinuous data may be generated due to an accidental level fluctuation such as noise; however, latch data with a level due to noise may not be identified. Thus, the data midpoint calculation circuit 63 determines the latch data in the pattern 8 to be invalid.

The pattern 3 includes one first transition and one second transition, however, latch data of a period according to the first transition and the second transition is one data unit (D (+2)). In the example, based on a pulse width of the data DQ, three to four units of latch data may exist between the first transition and the second transition, and by taking account of allowable level fluctuations, two to five latch data may exist. Accordingly, when only one latch data unit may exist, it is highly likely that the data is generated by noise. Therefore, the data midpoint calculation circuit 63 may store the number of latch data unit exist between a first range and a second range, in other words, stores a range of the number of the timings in the register etc, and may determine the number of data unit (the number of timings) in the range as valid and the number of latch data outside of the range may be determined to be invalid.

Calculation processing such as round down, round off, and using a substantially large integer that does not exceed the average value etc. may be performed. For example, when round down is set for calculation processing, a period central value DR that is close to the reference delay signal S (0) is obtained and when the absolute value is an average value of less than 1, the period central value DR becomes 0. Accordingly, responsiveness for a difference between the delay signal DQSd and the data DQ becomes low. As a result, a difference of the timings may be gradually corrected.

As illustrated in FIG. 8, the averaging circuit 64 includes an adding circuit 71, a counter 72, and a dividing circuit 73.

The adding circuit 71 accumulatively adds period central values DR that are output from the data midpoint calculation circuit 63 and outputs the calculation result data.

The counter 72 counts up (+1) a count value in response to a valid data flag DF among data flags DF that are output from the data midpoint calculation circuit 63 and outputs the count value. In other words, the counter 72 counts the number of data flags DF of 1.

The dividing circuit 73 calculates an average value of a central position of valid data. In other words, the dividing circuit 73 divides a calculation result (total value) output from the adding circuit 71 by the count value (the number of valid data units) output from the counter 72 and calculates an average value based on the calculation result. For example, the dividing circuit 73 generates a calculation result by rounding up a value below a decimal point among the calculation result. The dividing circuit 73 makes an integer value from the calculation result by rounding down a value below decimal point and outputs the value after the rounding down. In other words, the averaging circuit 64 calculates an average value of the period central values DR calculated by the data midpoint calculation circuit 63.

The phase update signal generation circuit 65 generates an update permission signal UE for updating setting data of the DLL circuit based on an activation signal PE that is output from the phase adjustment signal generation circuit 62. According to the embodiment, the activation signal PE is obtained by buffering a read enable signal RE that indicates a period for reading data DQ from the memory 12. The phase update signal generation circuit 65 generates an update permission signal UE so that setting data is updated during a period in which data DQ is not read from the memory 12. For example, the phase update signal generation circuit 65 generates an update permission signal UE with a level that is obtained by logically inverting an activation signal PE. Hence, the update permission signal UE becomes an L level when data DQ is read from the memory 12 and other than the period the update permission signal UE becomes an H level.

The code conversion circuit 66 converts a period central value that is output from the averaging circuit 64 to a code for adjusting a delay time of the DLL unit 31b. The code conversion circuit 66 outputs the code to the DLL unit 31b during a period in which the data DQ is not read from the memory 12, in other words, in response to an H level update permission signal UE, based on the update permission signal UE output from the phase update signal generation circuit 65. The DLL unit 31b stores the code in the register 41 (refer to FIGS. 6A and 6B).

For example, in the DLL unit 31b illustrated in FIG. 6, delay signals S (−3) to S (+3) are generated in which delay times are adjusted by the turned on switch SW1d. Under the state, when a period central value is +1, the code conversion circuit 66 converts the central period into a code for controlling the switch in the DLL unit 31b. The DLL unit 31b turns off the switch SW1d and turns on the switch SW1e in response to the code. As a result, timing of the delay signals S (−3) to S (+3) is shifted to a delay signal with a later timing, and timing of the reference delay signal S (0) coincides with a timing of the previous delay signal S (+1).

As described above, according to the embodiment, the following effects may be achieved.

The latch circuit 32 outputs a plurality of latch data D (−n) to D (+n) obtained by latching data DQ by a plurality of delay signals S (−n) to S (0) to S (+n) with different phases (timings). The phase adjustment circuit 33 determines a first transition and a second transition of data DQ based on the plurality of latch data D (−n) to D (+n) and adjusts a delay time of the DLL circuit 31 so that a central timing of a period according to the first and the second transition becomes close to the timing of the reference delay signal S (0). As a result, a difference of phases between the data DQ and data strobe signal DQS is reduced because timing of the reference delay signal S (0) is adjusted so as to be close to the central timing of the pulse of the data DQ read from the memory 12.

The phase adjustment circuit 33 determines a first transition and a second transition of data DQ with a randomly changing signal level, for example, data DQ read from the memory 12 according to a request from the core circuit 21. Moreover, the phase adjustment circuit 33 adjusts a central timing of the delay signal DQSd generated by the DLL circuit 31 according to a central timing of a period according to the first and the second transitions. Hence, there is no need to suppress (stop) read operation of the core circuit 21 for adjusting timing, and overhead for reading data from the memory 12 may be reduced because timing of the delay signal DQSd for taking in data DQ may be adjusted when the core circuit 21 reads data DQ from the memory 12.

The phase adjustment circuit 33 adjusts so that the central timing of the delay signal DQSd (timing of the reference delay signal S (0)) generated by the DLL circuit 31 becomes close to the central timing of a period according to the first transition and the second transition. Thus, a difference of timing due to, for example, temperature change may be corrected during operation of the core circuit 21. Increase in overhead for read operation to the memory 12 may be suppressed because a difference of timings may be corrected during operation of the core circuit 21.

A second embodiment will be described by referring to accompanying drawings.

The same reference numerals are applied to components that are substantially the same as those described in the above embodiment and a part of, or a whole of description will be omitted.

Figure 10:
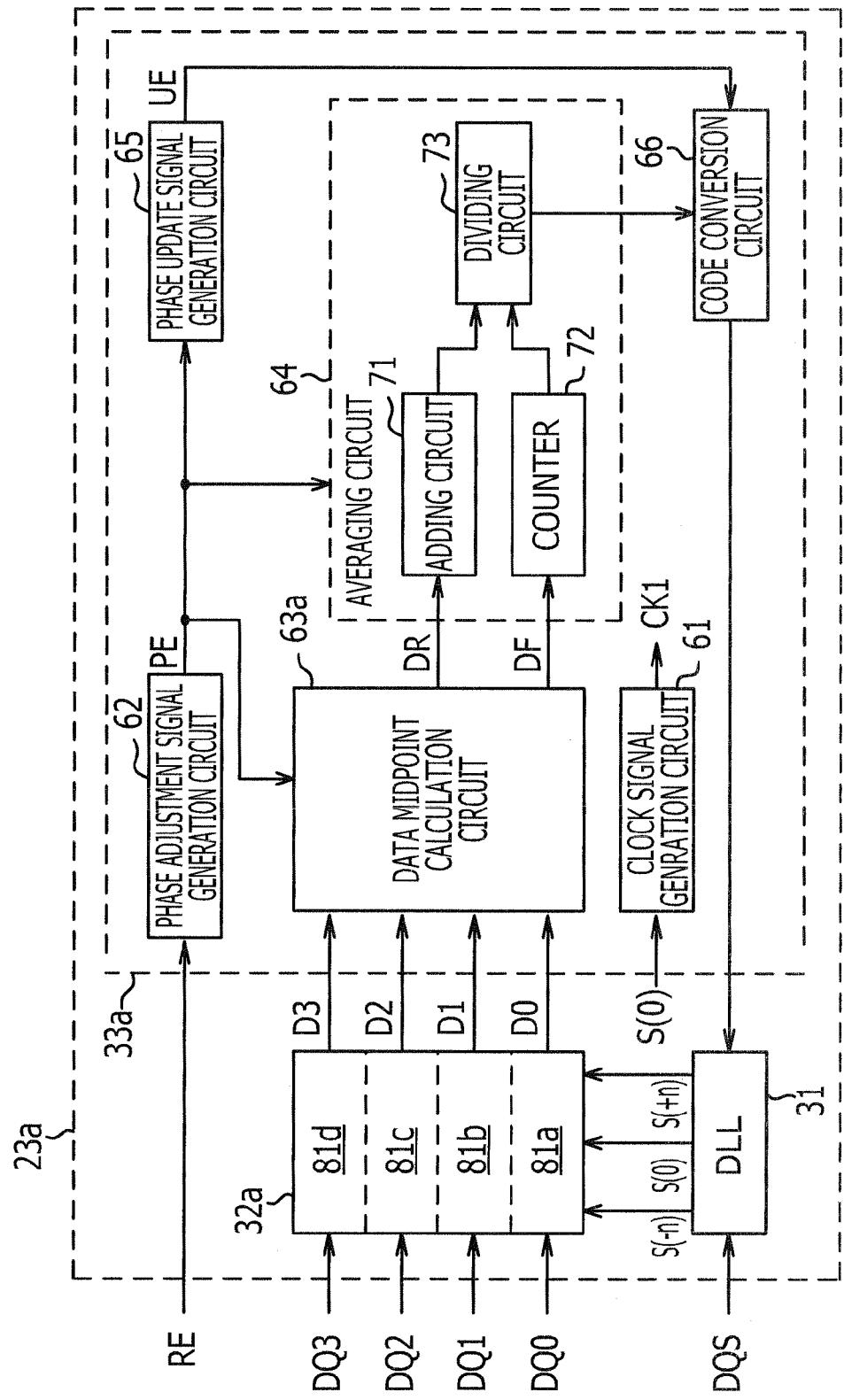
FIG. 10 illustrates a phase adjustment circuit according to a second embodiment.

FIG. 10 illustrates a circuit diagram of an interface circuit 23a according to a second embodiment. Four-bit data DQ0 to DQ3 is input to the interface circuit 23a. In other words, the interface circuit 23a includes four output terminals and coupled to a memory that outputs 4 bit data DQ0 to DQ3 based on a data strobe signal DQS. The interface circuit 23a adjusts timing to receive the 4-bit data DQ0 to DQ3 based on the 4-bit data DQ0 to DQ3 and the data strobe signal DQS.

The interface circuit 23a includes a DLL circuit 31, a latch circuit 32a, and a phase adjustment circuit 33a.

The latch circuit 32a includes four blocks 81a to 81d corresponding to the 4-bit data DQ0 to DQ3. Each of the blocks 81a to 81d is configured substantially the same manner as the latch circuit 32 according to the first embodiment. Each of the blocks 81a to 81d latches the data DQ0 to DQ3 in response to the delay signals S (−n) to S (+n) and outputs latch data D0 to D3 respectively. FIG. 10 illustrates each latch data D0 to D3 as taken in by one signal, however each latch data D0 to D3 includes latch data that is obtained by taking in data DQ0 to DQ3 by delay signals S (−n) to S (+n) with different timings. For example, the latch data D0 includes latch data D0 (−n) to D0 (+n) that is obtained by latching data DQ0 by delay signals S (−n) to S (+n) in the block 81a. Likewise, the latch data D1 includes latch data D1 (−n) to D1 (+n) that is obtained by latching data DQ1 by delay signals S (−n) to S (+n) in the block 81b. The latch data D2 includes latch data D2 (−n) to D2 (+n) that is obtained by latching data DQ2 by delay signals S (−n) to S (+n) in the block 81c. The latch data D3 includes latch data D3 (−n) to D3 (+n) that is obtained by latching data DQ3 by delay signals S (−n) to S (+n) in the block 81d.

The phase adjustment circuit 33a includes a clock signal generation circuit 61, a phase adjustment signal generation circuit 62, a data midpoint calculation circuit 63a, an averaging circuit 64, a phase update signal generation circuit 65, and a code conversion circuit 66.

The data midpoint calculation circuit 63a performs, for each of the timings, a logical operation of valid latch data among latch data D0 to D3 that correspond to the 4 bit data DQ0 to DQ3 and calculates a period central value DR based on the logical operation result. The determination of the valid latch data is substantially the same as that of the first embodiment.

FIG. 11 illustrates an example of latch data when n=3.

In FIG. 11, as in FIG. 9, values surrounded by the dotted lines indicate data levels latched by timing in a period according to the first transition and the second transition.

For example, latch data D0 (−3) to D (+3) obtained by latching data DQ0 is 0001110, and a first transition and a second transition exist one each. Thus, the data midpoint calculation circuit 63a illustrated in FIG. 10 determines the latch data that corresponds to the data DQ0 as valid. Similarly, the data midpoint calculation circuit 63a determines the latch data D1 (−3) to D1 (+3), and D3 (−3) to D3 (+3) that is obtained by latching data DQ1 and DQ3 as valid. On the other hand, latch data D2 (−3) to D2 (+3) which is obtained by latching data DQ2 is 1111111. Therefore, the data midpoint calculation circuit 63a determines the latch data that corresponds to the data DQ2 as invalid.

The data midpoint calculation circuit 63a performs, for each of the timings, logical operation for the latch data determined to be valid and calculates a central timing of a period (central period) according to a first transition and a second transition. In FIG. 11, data 0001110 illustrated in AND indicates a result of AND operation. The data midpoint calculation circuit 63a calculates a period central value DR (=+1) based on the data. The data midpoint calculation circuit 63a outputs a data flag DF (=1) that indicates the period central value DR is valid.

The data midpoint calculation circuit 63a does not perform logical operation when latch data determined to be valid is for 1 bit and calculates the period central value DR based on the latch data determined to be valid. The data midpoint calculation circuit 63a does not perform logical operation and calculation of a center value and outputs a period central value DR of 0 and a data flag DF of 0 that indicates the period central value DR is invalid when latch data for all bits are determined to be invalid.

The averaging circuit 64 calculates an average value of the period central value DR that is output from the data midpoint calculation circuit 63a and converts the average value into a code. The code is stored in the DLL circuit 31 (DLL unit 31b) during a period in which data DQ0 to DQ3 is not read. In this manner, the phase adjustment circuit 33a performs correction so that a central timing of the delay signals S (−n) to S (+n) for taking in data DQ0 to DQ3 become close to a common timing of a center of a pulse of the data DQ0 to DQ3.

As described above, according to the second embodiment, the following effects may be achieved. The latch circuit 32a outputs latch data obtained by latching data DQ0 to DQ3 with a plurality of bits by a plurality of delay signals with different timings. The phase adjustment circuit 33a determines a first transition and a second transition of data DQ0 to DQ3 according to the latch data. Moreover, based on the determination result, the phase adjustment circuit 33a adjusts a central timing of the delay signal so that the central timing of the delay signal becomes close to the central timing of the result of logical operation for the latch data that corresponds to the data DQ0 to DQ3. Accordingly, timing of data strobe signal DQS common to each of the data DQ0 to DQ3 may be adjusted to timing that is appropriate for taking in all of data DQ0 to DQ3.

A third embodiment will be described by referring to accompanying drawings.

In the third embodiment, the same reference numerals are applied to components that are substantially the same as those described above and a part of, or a whole of description will be omitted.

Figure 12:
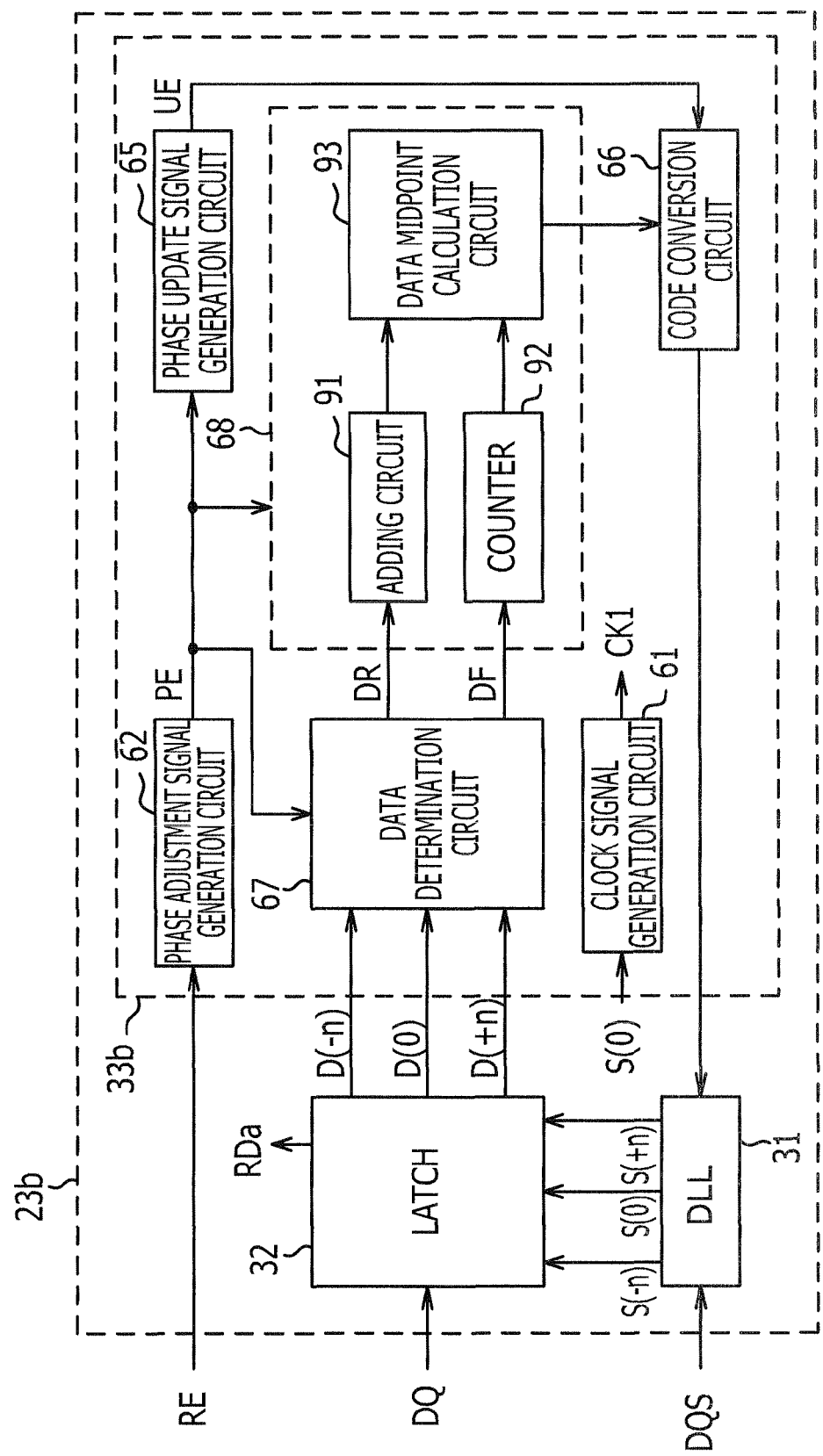
FIG. 12 illustrates a phase adjustment circuit according to a third embodiment.

FIG. 12 illustrates a circuit diagram of an interface circuit 23a according to the third embodiment. The interface circuit 23a is replaced with the interface circuit 23 according to the above described first embodiment. In other words, a system circuit according to the embodiment, includes the core circuit 21 and the memory controller 22 illustrated in FIG. 3 and the interface circuit 23b illustrated in FIG. 12.

The interface circuit 23b includes a DLL circuit 31, a latch circuit 32, and a phase adjustment circuit 33b.

The phase adjustment circuit 33b includes a clock signal generation circuit 61, a phase adjustment signal generation circuit 62, a code conversion circuit 66, a data determination circuit 67, and a period center detection circuit 68.

The data determination circuit 67 provides a determination function included in the data midpoint calculation circuit 63 according to the above described embodiment, in other words, a function to determine whether latch data is valid or invalid and outputs latch data that is determined to be valid and a data flag DF that indicates that the data is valid. The latch data D includes latch data D (−n) to D (+n) that is obtained by taking in data DQ with delay signals S (−n) to S (+n).

The data determination circuit 67 outputs latch data by inverting logic level thereof when a data level of a period according to the first transition and the second transition is 0. For example, when latch data is 1111001 of the pattern 6 illustrated in FIG. 9, the data determination circuit 67 outputs 0000110 by logically inverting a level of each latch data.

The period center detection circuit 68 includes an adding circuit 91, a counter 92, and a data midpoint calculation circuit 93. The adding circuit 91 accumulatively adds latch data D (−n) to D (+n) that are output from the data determination circuit 67 for each timing and outputs the calculation result data.

FIG. 13 illustrates an example of latch data when n=3.

In FIG. 13, as in FIG. 9, values surrounded by the dotted lines indicate data levels latched by timing in a period according to the first transition and the second transition.

In FIG. 13, data 1 to 4 is valid data while data 5 to 7 is invalid data. The data determination circuit 67 outputs data 1 to 4 (latch data) together with a data flag DF of 1, and does not output data 5 to 7. The adding circuit 91 accumulatively adds data 1 to 4. In FIG. 13, the bottom line indicates result of addition (accumulative value) for data 1 to 4 by the adding circuit 91.

The counter 92 counts data flags DF that are output from the data determination circuit 67, and when the count value becomes substantially equals to a setting value, outputs a count up signal. The setting value is data that is output from the data determination circuit 67. In other words, the number of latch data that is added.

The data midpoint calculation circuit 93 is input with an accumulated value that is output from the adding circuit 91 in response to the count up signal output from the counter 92 and calculates a central timing of the period based on the accumulated value.

As described above, the data determination circuit 67 outputs both ends of latch data as 0 among latch data for a plurality of timings. Thus, the value accumulated for each of the timings is based on existence probability of a pulse center of data DQ. In other words, an accumulated value that corresponds to a timing that receives a pulse center of the data DQ is substantially the largest value. Thus, the data midpoint calculation circuit 93 outputs the timing with the largest accumulated value as a period center. When accumulated values for the plurality of timings become substantially equal, the data midpoint calculation circuit 93 assumes an average value of the numbers for the timings as a period center.

The code conversion circuit 66 converts a period central value output from the data midpoint calculation circuit 93 into a code. The code is stored in the DLL circuit 31 (DLL unit 31b) during a period in which data DQ is not read. In this manner, the phase adjustment circuit 33b performs correction so that a central timing of the delay signals S (−n) to S (+n) for taking in the data DQ becomes close to a timing of a pulse center of the data DQ.

As described above, according to the third embodiment, the following effects may be achieved.

The phase adjustment circuit 33b determines a first transition and a second transition of data DQ based on the plurality of latch data D (−n) to D (+n) and calculates a center of a period according to the first transition and the second transition based on the addition result. The phase adjustment circuit 33b performs correction so that the central timing of the delay signals S (−n) to (+n) becomes close to the calculated central timing. As a result, a phase difference between data DQ and data strobe signal DQS may be reduced because the timing of the reference delay signal S (0) is adjusted to become close to the central timing of a pulse of the data DQ read from the memory 12.

Each embodiment may be further performed according to the following description.

In the second embodiment, the data midpoint calculation circuit 63a may determine whether latch data is valid or invalid according to the number of bits of data. For example, a period central value DR may be calculated for 4-bit data where 2-bit data or more is valid. Moreover, a period central value DR may be calculated for 8-bit data where 3-bit data or more is valid. In this way, differences of central timings for delay data that is common to a plurality of bits may be corrected.

In each embodiment, the phase update signal generation circuit 65 may output an update permission signal UE for updating after calculating an average value of a period central value. For example, the counter 72 outputs a count up signal when a count value (for example, 100) for calculating an average value is counted, and the phase update signal generation circuit 65 outputs an update permission signal UE with a level that logically inverts an activation signal PE (or a read enable signal RE) in response to the count up signal. The counter may output a count value and output an update permission signal UE when the phase update signal generation circuit 65 is input with the count value for calculating an average value. Moreover, the counter may output a count value, the dividing circuit may output a signal when an average value is calculated, and the phase update signal generation circuit 65 may output an update permission signal UE by the signal.

The embodiment includes the phase adjustment signal generation circuit 62, however, the circuit 62 may be omitted and a read enable signal RE is supplied to each of the circuits included in the phase adjustment circuit 33.

According to the embodiment, the memory controller 22 is used for training operation of the data strobe signal DQS, however a memory controller without a training operation function may be used. In this case, a setting code is set in the delay unit 31a of the DLL circuit 31 so that a delay signal DQS2 that is not delayed from the data strobe signal DQS may be generated. The delay unit 31a may be omitted.

According to the embodiment, the memory controller 22 performs a training operation. However, another circuit, for example, the core circuit 21 may alternatively perform a training operation.

Each of the embodiments describes the system circuit 11 that includes the interface circuit 23. However, the above described interface circuit may be applied to a circuit that receives data DQ and a data strobe signal DQS, for example, an SDRAM or a memory controller.

According to each of the embodiments, as illustrated in FIG. 6, a delay time of the delay signals S (−n) to S (+n), in other words, a phase difference is substantially constant. However, phases of delay signals may be set to be different. For example, in the delay signals S (−n) to S (+n), a phase difference of delay signals around timing where an edge of data DQ is likely to exist may be set to be smaller than a phase difference around timing where an edge of data DQ is unlikely to exist. The delay signal with a small phase difference improves accuracy to detect a first transition and a second transition of the data DQ. Accordingly, a small phase difference between, in other words, phase deviation of the reference delay signal S (0) and a center of data DQ may be detected with high accuracy; thereby the reference delay signal S (0) may be adjusted to a center of data DQ with high accuracy.

According to the embodiment, the counter 72 outputs a count value and the dividing circuit 73 performs a calculation using the count value as a divisor. A setting value stored in a register included in a counter is compared with the count value and when the count value is lower than the setting value, a first level (for example, an L level) count end signal is output, and when the setting value and the count value is substantially equal, the count up is stopped and a second level (for example, an H level) count end signal may be output. The dividing circuit may perform calculation using the setting value as a divisor.

According to each embodiment, the data midpoint calculation circuit 63 rounds up below a decimal point and the averaging circuit 64 rounds down values that are smaller than one. However, the data midpoint calculation circuit 63 may round down below a decimal point and the averaging circuit 64 may round up values that are smaller than one. Alternatively, the calculation result may be made into an integer by applying substantially the same processing that rounds down values that are smaller than one at both the data midpoint calculation circuit 63 and the averaging circuit 64. As a method to make the calculation result into an integer value, various methods may be used other than the above described rounds up, for example, rounds down, rounds off, and using a maximum value that does not exceed the calculation result.

According to each embodiment, among delay signals S (−3) to S (+3), by focusing on a delay signal that is close to a central timing of a first transition and a second transition of an input signal, an output signal of the latch circuit (for example, one of latch circuits 53a to 53g illustrated in FIG. 7) to which the delay signal close to the central timing is input is selected, and the selected signal (one of LDa to LDg) may be input to the latch circuit 55.

According to the second embodiment, among latch data that is obtained by latching each of 4-bit data, a central position is calculated after performing an AND operation for valid latch data. However, the central position may be calculated after performing other logical operations such as an OR operation.

Each embodiment is achieved by the interface circuit 23 that receives data DQ output from the memory 12. However, the embodiment may be achieved by an input circuit that receives a signal output from a circuit other than the memory, for example, a circuit that receives a signal output from a circuit for communication.

Each embodiment is achieved by the interface circuit 23 that receives data DQ based on a data strobe signal DQS. However, each embodiment may be embodied with a circuit that receives data with other signals such as a clock signal.

According to the above-discussed embodiments, differences of timings for taking in an input signal may be corrected.

Although the embodiments in accordance with aspects of the present invention are numbered with, for example, "first," "second," or "third," the ordinal numbers do not imply priorities of the embodiment. Many other variations and modifications will be apparent to those skilled in the art.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a showing of the superiority and inferiority of the aspects of the invention. Although the embodiments in accordance with aspects of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A timing adjustment device comprising:
   a plurality of receive circuits that receive an input signal based on mutually different timings;
   a determination circuit that determines a first transition and a second transition of the input signal based on a received result by one or more receive circuits, among the plurality of receive circuits, that receives the input signal with adjacent timings among different timings of the plurality of receive circuits, that calculates a central timing of a period between a timing of the first transition and a timing of the second transition when determining the received input signal as valid when the received input signal includes the first transition and the second transition, that determines that the received input signal is invalid when the received input signal does not include both the first transition and the second transition, and that outputs information of the received input signal indicating valid or invalid; and an adjustment circuit that adjusts a receiving timing of the input signal based on the information so that the receiving timing of the input signal becomes close to the central timing of the period.

2. The timing adjustment device according to claim 1, wherein the adjustment circuit adjusts the central timing of the mutually different timings for receiving the input signal so that the central timing becomes close to the central timing of the period.

3. The timing adjustment device according to claim 2, wherein the determination circuit determines that a transition exists in the input signal when levels of the input signal, according to adjacent receive circuits, are different.

4. The timing adjustment device according to claim 2, wherein the adjustment circuit adjusts the central timing of the mutually different timings so that the central timing of the mutually different timings become close to the central timing of the period calculated by the determination circuit.

5. The timing adjustment device according to claim 4, wherein
the determination circuit outputs a period central value according to the calculated central timing; and
the adjustment circuit calculates an average value of a plurality of period central values that are output from the determination circuit, and adjusts the central timing of the mutually different timings so that the central timing of the mutually different timings becomes close to the average value of the plurality of period central values.

6. The timing adjustment device according to claim 2, wherein
the input signal includes a plurality of bits; and
the determination circuit determines the first transition and the second transition for received results of each of the plurality of bits included in the input signal.

7. The timing adjustment device according to claim 6, wherein the adjustment circuit performs a logical operation on the received result of each bit of the plurality of bits for each of the mutually different timings for receiving the input signal based on the determination result by the determination circuit, and based on a logical operation result, adjusts the central timing of the mutually different timings so that the central timing of the mutually different timings becomes close to a central timing of a period according to the first transition and the second transition.

8. The timing adjustment device according to claim 2, wherein the adjustment circuit calculates the central timing of a period according to the first transition and the second transition based on a received result that is determined to be valid by the determination circuit and adjusts the central timing of a period according to the first transition and the second transition so that the central the timing among the mutually different timings becomes close to the central timing of a period according to the first transition and the second transition.

9. The timing adjustment device according to claim 1, wherein the adjustment circuit accumulates the received result that is determined to be valid by the determination circuit for each timing to receive the input signal and calculates the central timing of a period according to the first transition and the second transition based on an accumulated result for each timing.

10. A system comprising:
a core circuit;
a controller; and
an interface circuit;
wherein the core circuit reads data from a target circuit that is coupled to the interface circuit through the controller;
wherein the interface circuit receives an input signal that is output from the target circuit based on a strobe signal that is output from the target circuit;
wherein the interface circuit includes a timing adjustment device that adjusts a timing to receive the input signal;
wherein the timing adjustment device receives an input signal based on a plurality of mutually different timings, determines a first transition and a second transition of the input signal which is received on adjacent timings among the plurality of timings, calculates a central timing of a period between a timing of the first transition and a timing of the second transition when determining the received input signal as valid when the received input signal includes the first transition and the second transition, determines that the received input signal is invalid when the received result does not include both the first transition and the second transition, outputs information indicating that the received input signal is valid or invalid, and adjusts a receiving timing of the input signal based on the information so that the receiving timing of the input signal becomes close to the central timing of the period.

11. A timing adjustment method comprising:
receiving an input signal based on a plurality of different timings;
determining a first transition and a second transition of the input signal received based on adjacent timings among the plurality of timings;
calculating a central timing of a period between a timing of the first transition and a timing of the second transition when the received input signal is determined to be valid, wherein the received input signal includes the first transition and the second transition;
determining that the input signal is invalid when the received input signal does not include both the first transition and the second transition;
outputting information indicating that the received input signal is valid or invalid; and
adjusting a receiving timing of the input signal based on the information so that the receiving timing of the input signal becomes close to the central timing of the period.

* * * * *